US011211516B2

(12) United States Patent
Strobl

(10) Patent No.: US 11,211,516 B2
(45) Date of Patent: Dec. 28, 2021

(54) STACK-LIKE III-V SEMICONDUCTOR PRODUCT AND PRODUCTION METHOD

(71) Applicant: AZUR SPACE SOLAR POWER GMBH, Heilbronn (DE)

(72) Inventor: Gerhard Strobl, Stuttgart (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/034,847

(22) Filed: Sep. 28, 2020

(65) Prior Publication Data

US 2021/0013363 A1 Jan. 14, 2021

Related U.S. Application Data

(63) Continuation of application No. PCT/EP2019/000072, filed on Mar. 11, 2019.

(30) Foreign Application Priority Data

Mar. 26, 2018 (DE) ..................... 10 2018 002 426.2

(51) Int. Cl.
*H01L 31/18* (2006.01)
*H01L 31/0687* (2012.01)
(Continued)

(52) U.S. Cl.
CPC ...... *H01L 31/1848* (2013.01); *H01L 21/0254* (2013.01); *H01L 31/0687* (2013.01);
(Continued)

(58) Field of Classification Search
CPC . H01L 31/1848; H01L 33/0093; H01L 33/30; H01L 31/1892; H01L 31/0687;
(Continued)

(56) References Cited

U.S. PATENT DOCUMENTS 7,341,925 B2 * 3/2008 Kelly ..................... H01L 21/78
438/458
7,713,840 B2 5/2010 Kelly et al.
(Continued)

FOREIGN PATENT DOCUMENTS

DE       19640594 A1    4/1998
DE    102005047152 A1   4/2007
(Continued)

OTHER PUBLICATIONS

International Search Report dated Jun. 5, 2019 in corresponding application PCT/EP2019/000072.
(Continued)

*Primary Examiner* — Earl N Taylor
(74) *Attorney, Agent, or Firm* — Muncy, Geissler, Olds & Lowe, P.C.

(57) ABSTRACT

A stack-like III-V semiconductor product comprising a substrate and a sacrificial layer region arranged on an upper side of the substrate and a semiconductor layer arranged on an upper side of the sacrificial layer region. The substrate, the sacrificial layer region and the semiconductor layer region each comprise at least one chemical element from the main groups III and a chemical element from the main group V. The sacrificial layer region differs from the substrate and from the semiconductor layer in at least one element. An etching rate of the sacrificial layer region differs from an etching rate of the substrate and from an etching rate of the semiconductor layer region at least by a factor of ten. The sacrificial layer region is adapted in respect of its lattice to the substrate and to the semiconductor layer region.

20 Claims, 2 Drawing Sheets

(51) Int. Cl.
  *H01L 21/02* (2006.01)
  *H01L 33/00* (2010.01)
  *H01L 33/30* (2010.01)
(52) U.S. Cl.
  CPC ...... *H01L 31/1844* (2013.01); *H01L 31/1856* (2013.01); *H01L 31/1892* (2013.01); *H01L 33/0093* (2020.05); *H01L 33/30* (2013.01)
(58) Field of Classification Search
  CPC ........... H01L 31/06875; H01L 31/1844; H01L 31/1856
  See application file for complete search history.

(56) References Cited

U.S. PATENT DOCUMENTS

| | | | | |
|---|---|---|---|---|
| 7,964,890 | B2* | 6/2011 | Plossl | H01L 21/02505 257/103 |
| 8,711,893 | B2* | 4/2014 | Avramescu | H01L 33/0075 372/50.11 |
| 8,785,294 | B2* | 7/2014 | Murali | H01L 33/007 438/455 |
| 11,011,660 | B1* | 5/2021 | Derkacs | H01L 31/06875 |
| 2006/0083280 | A1* | 4/2006 | Tauzin | H01L 21/76254 372/46.01 |
| 2006/0099779 | A1* | 5/2006 | Cayrefourcq | H01L 21/76254 438/486 |
| 2006/0185582 | A1* | 8/2006 | Atwater | H01L 31/043 117/89 |
| 2012/0309172 | A1* | 12/2012 | Romano | H01L 21/02002 438/478 |
| 2013/0043214 | A1* | 2/2013 | Forrest | H01L 31/1896 216/95 |
| 2013/0089968 | A1* | 4/2013 | Usenko | H01L 21/3065 438/458 |
| 2016/0141431 | A1* | 5/2016 | Forrest | H01L 31/03046 136/256 |
| 2016/0351747 | A1* | 12/2016 | Forrest | H01L 31/0687 |
| 2021/0013363 | A1* | 1/2021 | Strobl | H01L 31/06875 |

FOREIGN PATENT DOCUMENTS

| | | |
|---|---|---|
| DE | 102008019268 A1 | 9/2009 |
| FR | 2954002 A1 | 6/2011 |

OTHER PUBLICATIONS

Altoukhov et al: "High reflectivity airgap distributed Bragg reflectors realized by wet etching of AlInN sacrificial layers," Applied Physics Letters, Nov. 9, 2009, pp. 191102-191102, vol. 95, No. 19, AIP Publishing LLC, US.

Simpson et al., "Implantation Induced Selective Chemical Etching of Indium Phosphide," Electrochemical and Solid-State Letters, Mar. 2001, pp. G26-G27, vol. 4, No. 3, IEEE Service Center, Piscataway, NJ, US; The Institution of Electrical Engineers, Stevenage, GB.

Chen et al: "High crystalline-quality III-V layer transfer onto Si substrate," Applied Physics Letters, Mar. 4, 2008, pp. 92107-92107, vol. 92, No. 9, AIP Publishing LLC, US.

* cited by examiner

STACK-LIKE III-V SEMICONDUCTOR PRODUCT AND PRODUCTION METHOD

This nonprovisional application is a continuation of International Application No. PCT/EP2019/000072, which was filed on Mar. 11, 2019, and which claims priority to German Patent Application No. 10 2018 002 426.2, which was filed in Germany on Mar. 26, 2018, and which are both herein incorporated by reference.

BACKGROUND OF THE INVENTION

Field of the Invention

The present invention relates to a stack-like III-V semiconductor product and a III-V semiconductor product production method.

Description of the Background Art

If semiconductor devices, especially III-V semiconductor devices, are produced epitaxially, a carrier or growth substrate with a suitable crystal structure is required at least on the surface. Depending on the type or material of which the carrier is made, it is desirable to reuse the carrier. For this purpose, the semiconductor device must be separated from the carrier after growth.

To this end, it is known to thermally decompose an interface that forms between the carrier and the grown semiconductor device, or a sacrificial layer region arranged between the carrier and the semiconductor device, for example by incident light. Then, the carrier and the semiconductor device can be separated along the interface or along the sacrificial layer region.

Corresponding semifinished products and methods are known, for example, from DE 10 2005 047 152 A1 (which corresponds to U.S. Pat. No. 7,964,890), DE 196 40 594 A1 (which corresponds to U.S. Pat. No. 6,559,075), FR 295 4002 A1, U.S. Pat. No. 7,785,989 B2 or DE 10 2008 019 268 A1 (which corresponds to U.S. Pat. No. 8,711,893).

US 2006/0185582 A1 discloses semifinished products and methods for producing and transferring a thin semiconductor film as a starting layer for further semiconductor layers.

Corresponding semifinished products and methods for silicon-based devices are known from U.S. Pat. No. 8,785,294 B2.

SUMMARY OF THE INVENTION

It is therefore an object of the present invention to provide a device that develops the prior art.

The object is achieved by a stack-like III-V semifinished product having the features of claim 1 and by a III-V semifinished semiconductor production method 10. Advantageous embodiments of the invention are the subject of dependent claims.

The III-V semiconductor product can comprise a substrate with a sacrificial layer region arranged on an upper side of the substrate and a semiconductor layer region arranged on an upper side of the sacrificial layer region. The aforementioned semiconductor layers form a stack.

The substrate and the sacrificial layer region and the semiconductor layer region each can comprise at least one chemical element from main group III and one chemical element from main group V.

At least a portion of the sacrificial layer region differs from the substrate and from the portion of the semiconductor layer region disposed directly on the surface of the sacrificial layer region by at least one element.

An etching rate for the sacrificial layer region differs from an etching rate for the substrate and an etching rate for the semiconductor layer region by at least a factor of 10.

The sacrificial layer region comprises an at least partially amorphized layer produced by implantation.

A III-V semiconductor product production method is also provided comprising a substrate for the formation of at least one semiconductor layer region.

Arranged on the substrate, a sacrificial layer region is produced for the substrate and then an at least partially amorphized layer is produced by implantation within the sacrificial layer region.

Subsequently, a semiconductor layer region is produced above the sacrificial layer region, wherein the substrate, the sacrificial layer region and the semiconductor layer region each comprise at least one chemical element from the main group III and one chemical element from the main group V.

In a further process step, the substrate is stripped from the semiconductor layer region along the sacrificial layer region.

In other process steps, a portion of the sacrificial layer region remaining on the substrate and on the semiconductor layer region is stripped by means of an etching process.

The etching rate for at least a portion of the sacrificial layer region differs from the etching rate of the substrate and from the etching rate for the portion of the semiconductor layer region arranged remotely on the surface of the sacrificial layer region by at least a factor of 10.

It should be noted that the term "arranged on the upper side" defines the order of the layers and includes a force-fit connection of the layers within the stack.

The semiconductor layer region can be formed over the entire area on the substrate. In a further development, the sacrificial layer region is formed over the entire area on the substrate.

The respective layers can each be arranged directly on top of one another, that is to say connected to one another in a cohesive manner. In particular, in one embodiment, the substrate and the sacrificial layer region and the semiconductor layer region are monolithic until stripping.

The etching rate for a specific etching solution or for a dry etching process (RIE etching) is the etching stripping per time. It is understood that the etching stripping for a material can be orientation-dependent or anisotropic.

If two materials are different with respect to their etching rate for the specific etching solution or dry etching process, then it is called selectivity or chemical selectivity between the two materials. Selectivity is typically expressed as a ratio of the etching rates of the two materials.

The different etching rates allow for a simple and reliable stripping of sacrificial layer region residue without etching the substrate or the semiconductor layer region.

As the preferred etching process, a wet chemical etching method with an etching solution can be carried out, for example with ammonia and hydrogen peroxide or potassium hydroxide or hydrochloric acid.

The sacrificial layer region can serve as a predetermined breaking point and that stripping of the semiconductor layer region from the substrate is made much easier. Damage to the semiconductor region or the substrate is avoided.

The layers can each be epitaxially grown on the substrate, for example by means of liquid phase epitaxy or by metal organic vapor phase epitaxy (MOVPE or MOCVD). It is understood that the growth temperature of the epitaxy is chosen to be as low as possible.

In particular, the growth temperature for the layer or layers of the semiconductor region lie below the annealing temperature of the amorphized layer. The growth temperature for the semiconductor region is preferably less than 600° C. Low growth temperatures can be achieved in particular with hydride-free sources.

An advantage of the invention is that the semiconductor layer region can be easily separated from the substrate sequence. In this way, substrates made of relatively expensive materials, such as a GaN substrate or an InP substrate or a GaAs substrate or further III-V substrates for the creation of a layer structure may be used in an economically viable manner.

In contrast to US 2006/0185582 A1, in the present case a sacrificial layer arranged on a starting substrate or a sacrificial layer arranged between a donor layer and the starting substrate are advantageously used. As a result, devices can be produced in a much less expensive manner and the environment is significantly less polluted.

It should also be noted that the development of devices based on III-V semiconductors relates to a completely different technical field as compared to the development of silicon-based devices. In other words, the development of III-V devices requires years of knowledge, in particular of the MOVPE epitaxy process. In particular, an expert in epitaxy has precisely no knowledge with regard to silicon in the field of III-V epitaxy MOVPE. The chemistry and the processes and the characteristics of the layers are completely different.

Due to the significant differences in the production method for silicon and for example, gallium arsenide, the method for silicon cannot be transferred to gallium arsenide. Silicon-based publications cannot presently be regarded as prior art.

Another advantage is that the expensive GaN or InP or GaAs substrate are not or are hardly used up and thus can be used as often as desired by the subsequent layers as growth seedlings for epitaxial growth.

Another advantage is that thinning of a substrate wafer can be avoided. This saves considerable resources and mostly avoids introducing problematic substances such as GaAs or InP or GaN into the environment.

The etching rate for at least a portion of the sacrificial layer region can differ by at least a factor of 100 or at least a factor of 1000 from the etching rate for the substrate as well as the etching rate for the semiconductor layer region.

The sacrificial layer region can comprise a plurality of sacrificial layers arranged on top of one another in the form of a stack. Preferably, the sacrificial layers which are in direct contact with the substrate and/or the semiconductor region have a chemical selectivity, in particular a wet chemical selectivity with respect to the other layers on the sacrificial layer region. The sacrificial layers which are in direct contact with the substrate and/or with the semiconductor region preferably have a lower etching rate than the further sacrificial layers.

The sacrificial layers which are in direct contact with the substrate and/or with the semiconductor region can be formed thinner than the other sacrificial layers. Preferably, the further sacrificial layers are arranged in the center or near the center of the sacrificial layer regions.

The sacrificial layers which are in direct contact with the substrate and/or with the semiconductor region can remain on the semiconductor region or on the substrate. In this respect, the sacrificial layers which are in direct contact with the substrate and/or with the semiconductor region are associated with the sacrificial layer region for reasons of clarity but are not sacrificed.

A portion or all of the sacrificial layer region is adapted in respect of its lattice to the substrate and to at least a portion of the semiconductor layer region. The entire semiconductor layer region is preferably adapted in respect of its lattice to the substrate.

The sacrificial layer region comprises or consists of a metamorphic buffer. Wherein the lattice constant of metamorphic buffer structure at least partially corresponds to the lattice constant of the substrate.

The sacrificial layer region comprises a first sacrificial layer and/or a second sacrificial layer and/or a third sacrificial layer.

The sacrificial layer region can include at least one layer or exactly one layer. The layer preferably comprises or consists of one or more of the following compounds (Al)GaAs, InGaAs, InP, AlAs, GaInP, $In_{18}Al_{82}N$, $In_{18}Al_{82}N$.

The sacrificial layer region can comprise exactly three sacrificial layers. Preferably, the two outer layers comprise or consist of InGaAs or AlAs or GaInP or AlGaAs. In a further development, the middle sacrificial layer comprises or consists of GaAs.

The sacrificial layer region can have a layer thickness of 0.1 μm to 10 μm or preferably 1 μm-3 μm.

The amorphized layer can be formed near the center or in the center of the sacrificial layer region. Preferably, the amorphized layer is produced using a proton beam. It should be noted that a proton beam can be generated easily and inexpensively with a hydrogen source.

Alternatively, other ions are also suitable for amorphization. For example, boron or arsenic atoms can also be implanted. It is understood that for this purpose the elements are each ionized prior to implantation.

The energy for implantation can be in a range between 20 keV and 500 keV. The dosage is preferably between 1e14 $N/cm^2$ and 1e16 $N/cm^2$.

The substrate can be formed of GaN or of GaAs or of InP. Instead of a semiconductor wafer as a substrate made of InP, which is very brittle and therefore difficult to process, only a layer of InP is present on the surface of a GaAs wafer. Such a structure is also referred to as a virtual substrate. One advantage is that this saves considerable costs.

The substrate and the semiconductor layer region can each have As and/or P and/or N as chemical elements from the main group V, and in each case In and/or Ga as chemical elements from the main group III. In addition, the sacrificial layer region includes Al.

The semiconductor layer region can have a layer thickness of 0.3 μm to 200 μm or 0.3 μm to 30 μm or 1 μm to 5 μm. One advantage is that electronic devices can be formed in the semiconductor layer region.

The semiconductor layer region can comprise a plurality of semiconductor layers, in particular III-V semiconductor layers. An advantage is that thereby, preferably GaAs devices or upright multi-junction solar cells (UMM solar cells) or reverse multi-junction solar cells (IMM solar cells, ILM solar cells) or GaN HEMT or GaN LEDs or GaN laser can be formed in a simple and inexpensive way. Preferably, IR high-power LEDs can be formed.

In the case of an IMM (inverted-metamorphic-multijunction) or ILM (inverted-lattice-matched) solar cells, the underside of the semiconductor layer region can follow the upper side of the stack, i.e. the sunlight first strikes the upper side of the stack. To this end, after stripping, the stack is turned over. The stack is also turned over when an IR high power LED is formed.

Prior to stripping, a carrier layer can be cohesively disposed on an upper side of the semiconductor layer region. For example, the support layer can be correspondingly only temporarily arranged on the upper side.

Prior to, or instead of, connection to a carrier layer, a dielectric layer and/or metallic layers can be arranged on the upper side of the semiconductor region. The dielectric layer in this case preferably serves as a passivation layer; the metallic layer, for example, as a contact layer.

The metallic layer can be designed as a mirror layer. This is particularly advantageous for the formation of an IR-LED structure or an IMM structure or an ILM structure.

The metallic layer and the passivation layer can also be structured. In particular, the contact layer can be formed as a finger structure.

It should be noted that a large number of different materials are suitable as a carrier layer. A particularly cheap and useful material is, for example, silicon or plastic or glass or germanium or a metal foil or a composite material. It is understood that the thermal expansion coefficients of the carrier layer and the material of the semiconductor region preferably differ only slightly so as to avoid stresses and cracks in the semiconductor region as much as possible.

The carrier layer serves in particular as a mechanical stabilization of the semiconductor layer region that is to be stripped. This way, cracks and defects owing to the stripping process can be reliably avoided in a simple and inexpensive manner.

If the semiconductor region comprises an IMM or ILM solar cell structure, it is advantageous to design the carrier layer as a substrate layer on the underside. The carrier layer preferably comprises a metallic contact layer. In the case of the solar cell structure, the metallic contact layer comprises in particular also the rear connection of the multi-junction solar cell structure and/or a mirror.

After stripping from the substrate, the portions of the sacrificial layer region remaining on the semiconductor layer region and on the substrate are stripped by means of an etching process. In another embodiment, CMP processes are also used in the stripping of sacrificial layer region residue.

The stripping can be initiated mechanically. To this end, a mechanical impulse is applied to the layer structure laterally at the level of and along the sacrificial layer region.

After stripping, portions of the sacrificial layer region remaining on the substrate and on the semiconductor layer region can be stripped by means of an etching process and the substrate is provided for reuse. In particular with the use of a wet chemical etching method, the sacrificial layer region residue can be easily, inexpensively and quickly stripped from the substrate and from the semiconductor layer region.

After stripping the sacrificial layer residue, a further chemical process and/or purification step and/or oxidation step can be carried out so as to prepare the surface of the substrate for another epitaxy (epi-ready).

A thin sacrificial layer can remain directly on the substrate. The thin sacrificial layer has a high chemical selectivity, in particular wet chemical selectivity, with respect to at least a portion of the other layers or layer residues of the sacrificial layer region.

After stripping, the surface of the semiconductor layer freed from the residue of the sacrificial layer region can be cohesively arranged on a carrier.

A thin sacrificial layer can remain directly on the semiconductor layer region. The thin sacrificial layer has a high level of chemistry-specific selectivity, in particular wet chemical selectivity, with respect to at least a portion of the other layers or layer residues of the sacrificial layer region.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
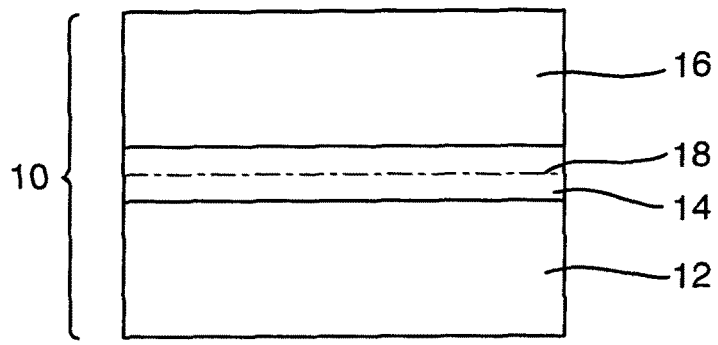
FIG. 1 is a view of an embodiment of a III-V semiconductor according to the invention.

The illustration in FIG. 1 shows an embodiment of a III-V semiconductor product 10, comprising a GaAs wafer as a substrate 12, a sacrificial layer region 14 comprising an AlGaAs layer, and a semiconductor layer region 16 comprising a GaAs layer. The sacrificial layer region 14 comprises an at least partially or completely amorphized layer 18 produced by implantation. In an embodiment, the sacrificial layer region 14 comprises exactly two semiconductor layers or exactly three semiconductor layers. The amorphized layer 18 allows for simple separation of the semiconductor layer region 16 from the substrate 12.

It should be noted that instead of a GaAs semiconductor wafer, a GaN semiconductor wafer or an InP semiconductor wafer or another III-V semiconductor wafer can also be used as a substrate 12. Instead of a wafer made of InP, in an embodiment, the substrate 12 comprises a layer of InP only on the surface of a GaAs wafer. Such a structure is also referred to as a virtual substrate. An advantage is that this way mechanical stability can be increased and considerable costs saved.

The chemical composition and the stoichiometry of the sacrificial layer region is preferably chosen in accordance with the substrate 12, so that the sacrificial layer region can preferably be formed adapted in respect of its lattice to the respective substrate 12, and, with regard to a subsequent etching process, can preferably be stripped particularly selectively with respect to the sacrificial layer region 14 and the substrate 12.

Figure 2:
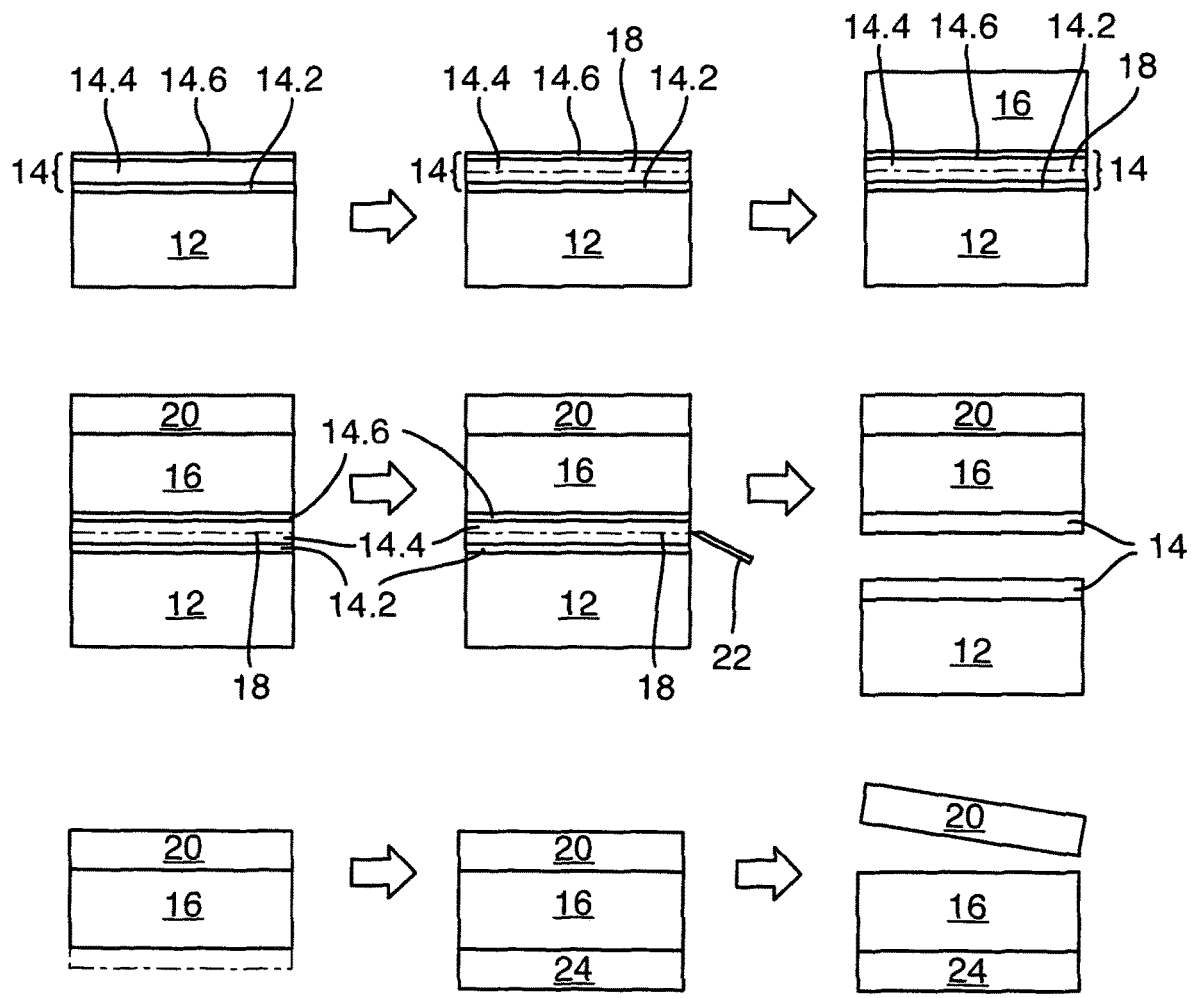
FIG. 2 is a view of an embodiment of a production method according to the invention.

The illustration in FIG. 2 shows an embodiment of a III-V semiconductor product production method according to the invention. A sacrificial layer region 14 with a first sacrificial layer 14.2 and a second sacrificial layer 14.4 and a third sacrificial layer 14.6 is produced on the carrier 12 by epitaxy.

Within the second sacrificial layer 14.4, the at least partially or completely amorphized layer 18 is produced by implantation. Here, the implantation step can be carried out both immediately after production of the second sacrificial layer 14.4 and after production of the third sacrificial layer.

The semiconductor layer region 16 is then grown, preferably epitaxially, on the sacrificial layer region 14.

In an embodiment, the semiconductor layer region 16 comprises several or a plurality of semiconductor layers according to an intended application. The semiconductor layers are preferably arranged on top of one another in the form of an epitaxial stack.

In particular, the semiconductor layers can be readily used for, for example, a GaN-HEMT or GaN-LED or for the formation of a multi-junction solar cell, in particular an inverted metamorphic multi-junction solar cell.

To form an IMM solar cell, as compared to conventional solar cells, the semiconductor layers are grown inverted with respect to the order of the band gaps.

Subsequently, the upper side of the semiconductor layer region 16 is cohesively connected to a carrier layer 20.

Provided that the semiconductor layer region 16 is thin, i.e. mechanically unstable, or also for other reasons, the application of the carrier layer 20 is preferably advantageous.

Subsequently, the sacrificial layer region 14 is mechanically notched laterally by means of a tool 22, preferably at the level of the amorphized layer 18, and the semiconductor layer region 16 is separated by the carrier layer 20 from the substrate 12 along the sacrificial layer region 14.

In an embodiment, a circumferential edge region of the sacrificial layer portion 14 is stripped again after the formation of the amorphized layer 18 and/or after the formation of further semiconductor layers, but prior to stripping by an etching process, so that the layer stack has a recessed step 18 in the sacrificial layer region 14.

After stripping, portions of the sacrificial layer region 14 remain on both the substrate 12 and the semiconductor layer region 16.

The remaining portions of the sacrificial layer region 14 are stripped by etching the support layer 12 and the semiconductor layer region 16 (shown as a dashed line only for the portion of sacrificial layer region 14 remaining on the semiconductor layer region 16).

In a further development, after complete stripping of the sacrificial layer region 14 from the underside of the semiconductor layer region 16, the underside of the semiconductor layer region 16 is at least force-fittingly arranged on a carrier 24 and the carrier layer 20 is stripped.

Preferably, in arranging the semiconductor layer region 16 on a carrier 24, for example by wafer bonding or by metal bonding, the semiconductor layer region 16 is cohesively connected to a carrier 24.

After stripping the sacrificial layer region 14 residue from the substrate 12, the substrate 12 is available for re-epitaxy.

Figure 3:
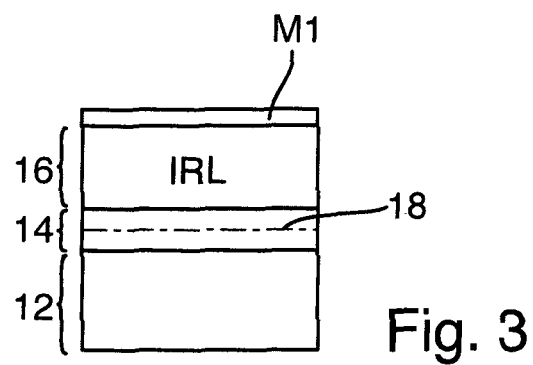
FIG. 3 is a view of an embodiment of an IR-LED structure in each case prior to stripping.

The illustration in FIG. 3 shows an embodiment of an IR-LED structure prior to being stripped. In the embodiment, on the substrate 12 formed as GaAs, a sacrificial layer 14 is made from AlGaAs and then an amorphized layer is produced in the center of the sacrificial layer 14 by implantation. A semiconductor region 16 comprising an IR-LED layer structure IRL is then epitaxially produced.

Hereafter, a full-surface metallic layer M1 is deposited on the upper side of the stack.

Figure 4:
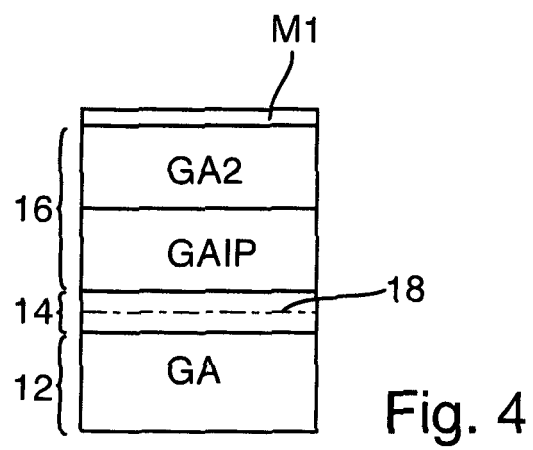
FIG. 4 is a view of an embodiment of an ILM lattice-matched double solar cell structure.

The illustration in FIG. 4 shows an embodiment of an ILM lattice-matched double solar cell structure prior to stripping. The semiconductor region 16 comprises a first subcell GAlP with GaInP and a second subcell GA2 with GaAs formed on a sacrificial layer GA made of GaAs.

In an embodiment, between the first subcell GAlP and the GaAs sacrificial layer, a further sacrificial layer is formed of AlInGaP. It is advantageous that the further sacrificial layer made of AlInGaP has a wet chemical selectivity to the GaAs sacrificial layer.

Both solar subcells and the sacrificial layer are adapted in respect of their lattice to the substrate and are monolithically stacked. It is understood that a tunnel diode is formed between the two solar subcells and the GaInP subcell has a larger band gap than the GaAs subcell. The metallic layer M1 or a semiconductor mirror is formed on the upper side.

Figure 5:
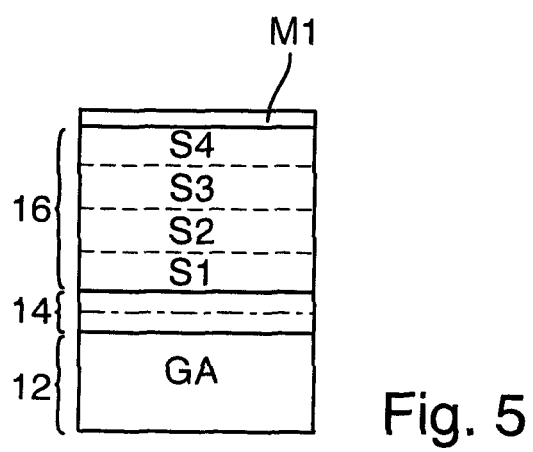
FIG. 5 is a view of an embodiment of an IMM four-junction solar cell prior to stripping.

In the embodiment shown in FIG. 5, an IMM four-junction solar cell structure is shown prior to stripping. Only the differences from the embodiment shown in FIG. 4 are explained below. The semiconductor region 16 comprises four solar subcells S1 to S4. It is understood that in each case a tunnel diode is formed between the individual solar subcells and the S1 subcell has a larger band gap than the S2 subcell and the S2 subcell has a larger band gap than the S3 subcell and the S3 subcell has a larger band gap than the S4 subcell. The solar subcells S1 to S4 are preferably monolithic.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stack-like III-V semiconductor product comprising:
   a substrate;
   a sacrificial layer region arranged on the substrate; and
   a semiconductor layer region arranged on a surface of the sacrificial layer region,
   wherein the substrate, the sacrificial layer region and the semiconductor layer region each comprise at least one chemical element from the main group III and one chemical element from the main group V,
   wherein at least a portion of the sacrificial layer region differs in at least one element from the substrate and from a portion of the semiconductor layer region arranged directly on the surface of the sacrificial layer region,
   wherein an etching rate for a predetermined etching process at least for a portion of the sacrificial layer region differs by at least a factor of 10 from the etching rate for the substrate as well as from the etching rate for the portion of the semiconductor layer region arranged directly on the surface of the sacrificial layer region, and
   wherein the sacrificial layer region comprises an at least partially amorphized layer produced by implantation,
   wherein the at least partially amorphized layer is arranged adjacent a center or in the center of the sacrificial layer region, and
   wherein the sacrificial layer region comprises three sacrificial layers and two outer layers of the three sacrificial layers include InGaAs or AlAs or GaInP or AlGaAs or consist of InGaAs or AlAs or GaInP or AlGaAs and a center sacrificial layer comprises or consists of GaAs.

2. The stack-like III-V semiconductor product according to claim 1, wherein the etching rates differ by at least a factor of 100 or at least a factor of 1000.

3. The stack-like III-V semiconductor product according to claim 1, wherein the sacrificial layers of the sacrificial layer region are arranged on top of one another in stacks.

4. The stack-like III-V semiconductor product according to claim 1, wherein at least a portion or the entire sacrificial layer region has a lattice constant adapted to the substrate and to at least a portion of the semiconductor layer region.

5. The stack-like III-V semiconductor product according to claim 1, wherein the amorphized layer is arranged in the center of the sacrifice layer region.

6. The stack-like III-V semiconductor product according to claim 1, wherein the sacrificial layer region includes a first sacrificial layer and a second sacrificial layer and a third sacrificial layer.

7. The stack-like III-V semiconductor product according to claim 1, wherein the sacrificial layer region comprises exactly three sacrificial layers.

8. The stack-like III-V semiconductor product according to claim 1, wherein the sacrificial layer region has a layer thickness of 0.1 µm-10 µm or 1 µm-3 µm.

9. The stack-like III-V semiconductor product according to claim 1, wherein the substrate is formed of GaN or of GaAs or of InP.

10. The stack-like III-V semiconductor product according to claim 1, wherein the semiconductor layer region has a layer thickness of 0.3 µm-30 µm or 1 µm to 5 µm.

11. A III-V semiconductor product production method, the method comprising:
providing a substrate;
producing a sacrificial layer region on the substrate, the sacrificial layer region being lattice adapted to the substrate;
producing an at least partially amorphized layer within the sacrificial layer region by implantation;
producing a semiconductor layer region, wherein the substrate, the sacrificial layer region and the semiconductor layer region comprise at least one chemical element selected from the main group Ill and one chemical element from the main group V;
stripping the substrate from the semiconductor layer region along the sacrificial layer region;
stripping a portion of the sacrificial layer region remaining on the substrate and on the semiconductor layer region via an etching process,
wherein an etching rate at least for a portion of the sacrificial layer region differs by at least a factor of 10 from the etching rate for the substrate as well as from the etching rate for the portion of the semiconductor layer region arranged directly on the surface of the sacrificial layer region,
wherein the at least partially amorphized layer is arranged adjacent a center or in the center of the sacrificial layer region, and
wherein the sacrificial layer region comprises three sacrificial layers and two outer layers of the three sacrificial layers include InGaAs or AlAs or GaInP or AlGaAs or consist of InGaAs or AlAs or GaInP or AlGaAs and a center sacrificial layer comprises or consists of GaAs.

12. The III-V semiconductor product production method according to claim 11, wherein at least a portion of or the entire sacrificial layer region is lattice adapted to at least a portion of the semiconductor layer region.

13. The III-V semiconductor product production method according to claim 11, wherein the amorphized layer is formed in the center of the sacrificial layer region.

14. The III-V semiconductor product production method according to claim 11, wherein the amorphized layer is produced using a proton beam.

15. The III-V semiconductor product production method according to claim 11, wherein implantation is carried out with an energy in a range between 20 keV and 500 keV and a dosage is between 1e14 N/cm$^2$ and 1e16 N/cm$^2$.

16. The III-V semiconductor product production method according to claim 11, wherein the stripping is mechanically initiated and is performed in the portion of the sacrificial layer region.

17. The III-V semiconductor product production method according to claim 11, wherein, prior to stripping, a carrier layer is arranged on an upper side of the semiconductor layer region.

18. The III-V semiconductor product production method according to claim 11, wherein, after stripping, the semiconductor layer region and the surface freed from sacrificial layer region residues are arranged on a carrier.

19. The III-V semiconductor product production method according to claim 11, wherein, after stripping, portions of the sacrificial layer region remaining on the substrate are stripped and the substrate is made available for reuse.

20. The III-V semiconductor product production method according to claim 11, wherein the semiconductor layer region is cohesively arranged on a carrier substrate.

* * * * *